US005691926A

United States Patent [19]

Cannon et al.

[11] Patent Number: 5,691,926
[45] Date of Patent: Nov. 25, 1997

[54] INTEGRATED TEST TOOLS FOR PORTABLE COMPUTER

[75] Inventors: Kim B. Cannon, Easley; Michael R. Hilley, Belton; B. Russell Bryan, Easley, all of S.C.

[73] Assignee: NCR Corporation, Dayton, Ohio

[21] Appl. No.: 359,968

[22] Filed: Dec. 20, 1994

[51] Int. Cl.$^6$ .................................................. G01R 19/00
[52] U.S. Cl. .................... 364/579; 364/481; 364/483; 395/282; 395/309; 395/701
[58] Field of Search .................... 364/579, 481, 364/483; 395/701, 500, 200.01, 200.16, 800, 822, 829, 309, 310, 281, 282, 283; 371/20.1, 29.1

[56] References Cited

U.S. PATENT DOCUMENTS

| | | | |
|---|---|---|---|
| 3,733,587 | 5/1973 | Lloyd et al. | 340/172.5 |
| 4,794,599 | 12/1988 | Purcell et al. | 371/21.2 |
| 5,537,558 | 7/1996 | Fletcher et al. | 395/309 |
| 5,564,055 | 10/1996 | Asnaashari et al. | 395/800 |
| 5,579,234 | 11/1996 | Wiley et al. | 364/481 |

OTHER PUBLICATIONS

Article Entitled "Computer, Software, P-C Cards Match up to Cut Costs in an Automatic Test System", *Electronics*, Jul. 6, 1970.

*Primary Examiner*—Emanuel T. Voeltz
*Assistant Examiner*—Demetra R. Smith
*Attorney, Agent, or Firm*—Paul J. Maginot

[57] ABSTRACT

A system for providing test tools at a remote location with a portable computer is disclosed. The system includes a peripheral interface coupled to the computer for communicating data between the computer and a unit under test. The test tool is implemented on a printed circuit card that, preferably, conforms to the dimensions and specifications of the card categories for the Personal Computer Memory Card Interface Association (PCMCIA) standard. The test tool receives and transmits signals to and from the unit under test so that an application program executing within said computer may display, analyze, or otherwise use the data received from the test tool which is controlled by the program. The test tool includes a tuple to identify the functionality of the tool. A card service interpreter within the computer communicates with the tool in accordance with the tuple information identifying the test tool.

11 Claims, 4 Drawing Sheets

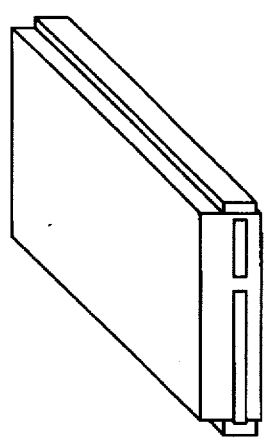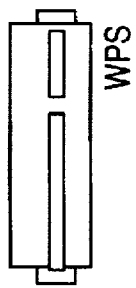
FIG. 3C
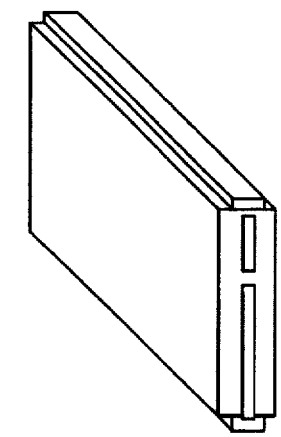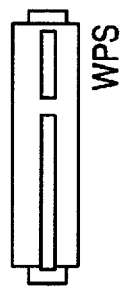
FIG. 3B
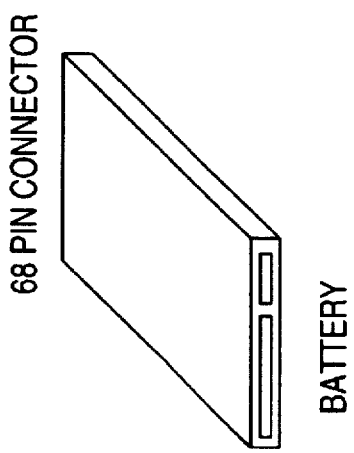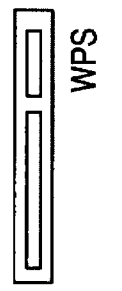
FIG. 3A

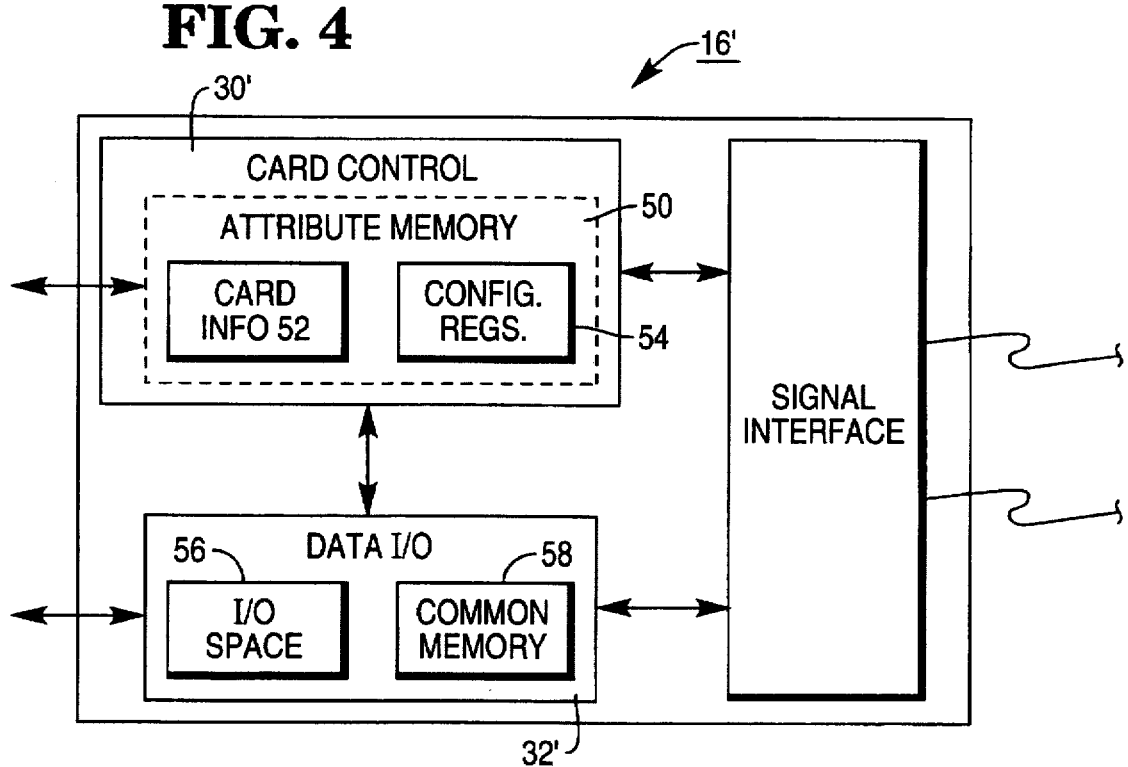

INTEGRATED TEST TOOLS FOR PORTABLE COMPUTER

FIELD OF THE INVENTION

This invention relates to electronic measuring devices and more particularly, to test tools used by field service personnel for maintenance and service of electronic/electrical devices in the field.

BACKGROUND OF THE INVENTION

Test tools for aiding service or maintenance personnel in testing or monitoring equipment in the field are known. Such tools include voltmeters, oscilloscopes, wave form generators, logic analyzers, tip and ring communication testers for phone lines, KS meters, spectrum analyzers, cable fault detectors and the like. Typically, these tools are carried on the belt of a service technician or carried by the technician to the equipment for monitoring and testing purposes. If the technician requires several different types of information to evaluate or test a particular piece of equipment, the logistics of bringing all of the test tools to the piece of equipment may become difficult to manage. In fact, the logistical demands for providing the test tools at the equipment site may become significant enough that it is easier to take the equipment out of service and send it to a lab for testing or evaluation. Of course, any time the equipment is taken out of service, a replacement unit must be installed or the down time associated with the equipment's removal from the field must be tolerated.

Also known are specialized computers used to input and analyze data in the field. For example, hand held computers for collecting vibrational data from motors or the like are known. Such devices may be used to analyze the data to determine whether the equipment should be scheduled for maintenance. However, these devices do not provide the versatility needed by a technician for troubleshooting but instead provide particular functionality for a specific purpose. For example, if a technician using the vibrational data collecting computer also wanted to verify the input voltage to the motor, the technician would need a voltmeter or the like. Thus, the computer makes specialized computing resources available in the field but fails to provide more general resources.

What is needed is a way of integrating a plurality of test tools into a single portable unit that may be easily transported to an equipment site for testing and evaluating equipment. What is needed is a single system which provides a number of general testing and monitoring functions.

SUMMARY OF THE INVENTION

Limitations of previously known portable test tools and specialized portable computers are overcome by a test tool system built in accordance with the principles of the present invention. Such a system includes a portable computer having a display, a peripheral interface coupled to said portable computer for communicating data between said portable computer and a unit under test, a test tool for receiving and transmitting signals between said test tool and the unit under test, the test tool including a test tool identifier for identifying a functionality for the test tool to the portable computer through the peripheral interface, and a tool interpreter for communicating with the test tool in accordance with the test tool identifier so that the portable computer may control the test tool and receive data from the test tool.

Such a system is capable of having different test tools coupled to the peripheral interface so that a user may utilize the tool interpreter in the portable computer to control the tool and receive data through the test tool. In this manner, a technician may carry a variety of test tools that simply require coupling to the communication interface in order to be available to the technician for testing and evaluating a piece of equipment. In a preferred embodiment, the peripheral interface is the PCMCIA interface and the test tools are printed circuit cards or the like which are provided with the electronic circuitry to perform a particular testing or monitoring function. Preferably, the test tool identifier is included within a tuple of the test tool card and the tool interpreter is a card service module of the PCMCIA specification. In this embodiment, the technician need only carry a collection of the printed circuit cards and, by coupling one of the cards into the PCMCIA interface, have available that particular test tool functionality. Because PCMCIA cards have relatively small physical dimensions, the technician may carry a significant number of the cards before the logistical requirements for carrying the cards make removal of the equipment from the field more economical or beneficial.

In yet another aspect of the invention, more than one peripheral interface is provided in the portable computer so additional test tools may be coupled to the portable computer and the tools used in conjunction with one another. For example, a logic analyzer may be implemented on a test tool printed circuit card and an oscilloscope function may be implemented on a second. By installing these two test tools into a first and second communication interface, respectively, the user may control the analyzer to generate a trigger signal on the occurrence of a particular condition of the unit under test and the oscilloscope may utilize the trigger signal to capture a wave form at a particular point within the equipment under test. The wave form data captured by the oscilloscope test tool may then be transferred to the portable computer for display by the tool interpreter.

In a further aspect of the invention, the tool interpreter may be provided with test tool modules for controlling and receiving data from the various test tools which may be coupled to the peripheral interfaces. Additionally, the test tool modules may further be provided with the ability of analyzing the data received from a test tool to provide still further information for the technician's consideration. For example, in the scenario given above, the wave form data may be further analyzed, such as by Fourier transform analysis, to determine the frequency components of the signal which may be indicative of equipment condition or the like. In this manner, the data collected by the test tools is further enhanced or analyzed by the computing resources available in the portable computer.

A still further advantage available by using the portable computer is the graphics capability in such a device. In a further aspect of the invention, the tool interpreter and test tool modules utilize display software to juxtapose the data displayed from different test tools, overlay or superimpose data from the tools on one another, or permit the user to manipulate the display data to provide additional information from the received data.

These and other features and advantages of a system built in accordance with the principles of the present system may be understood by the reading of the detailed description of the invention along with the drawings provided herewith.

BRIEF DESCRIPTION OF THE DRAWINGS

The present invention may take form in various components and arrangement of components and in various steps and arrangement of steps. The drawings are only for purposes of illustrating a preferred embodiment and are not to be construed as limiting the invention.

FIGS. 3(a), 3(b) and 3(c) are perspective views of the physical card profiles of the test tool cards shown in FIG. 1;

FIG. 4 is a block diagram of the software components used in the test tool cards of FIG. 1.

DETAILED DESCRIPTION OF THE INVENTION

Figure 1:
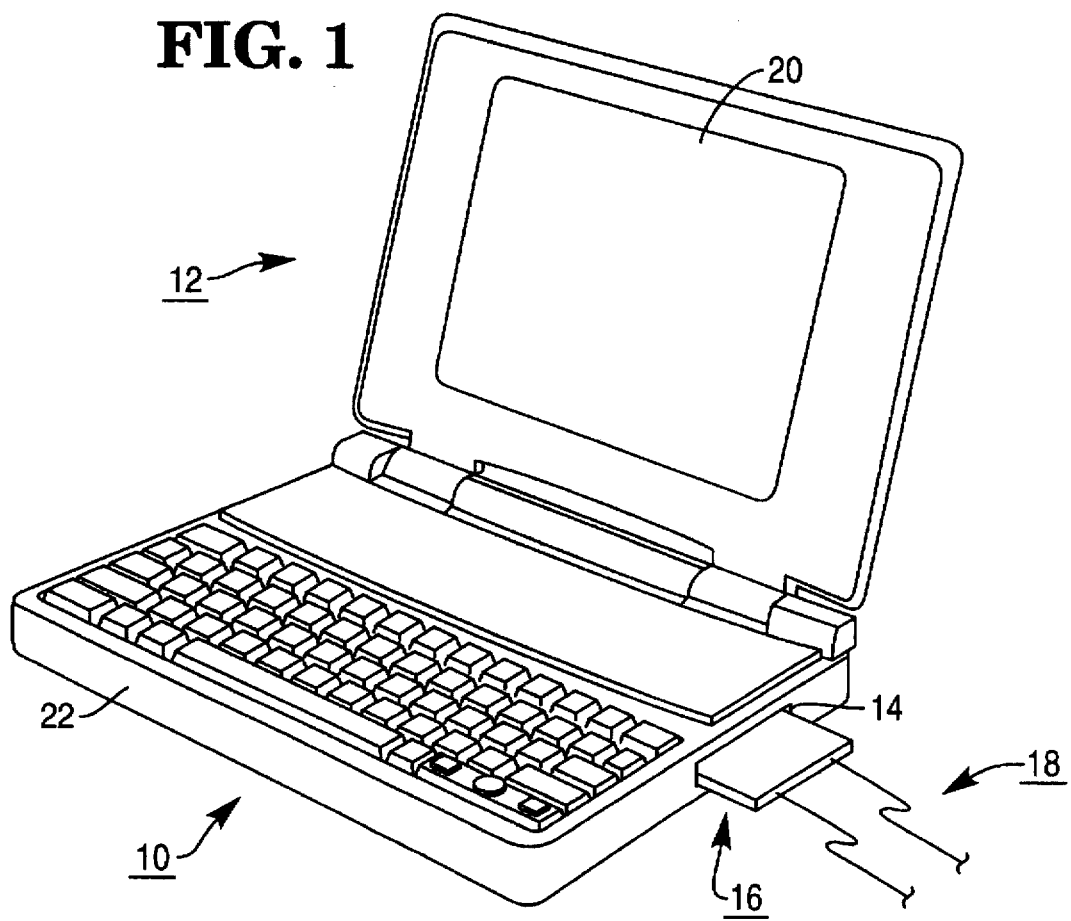
FIG. 1 is a block diagram of the components comprising a system made in accordance with the principles of the present invention.

FIG. 1 shows a system 10 made in accordance with the principles of the present invention to provide a plurality of portable test tools for a service technician. The system 10 includes a portable computer 12 which has a peripheral interface 14 to which a test tool card 16 is coupled. Extending from test tool card 16 are leads 18 which may be coupled to the equipment or unit under test to provide test signals to the unit or to receive data signals from the unit. Preferably, interface 14 and card 16 include mating connectors for coupling one to the other. Leads 18 may be provided with conventional clips for coupling to the unit under test or, if the unit is provided with a test plug or socket, leads 18 may be implemented with a cable having a mating connector at one end for the unit under test and for mating with a connector mounted to test tool card 16. Portable computer 12 further includes a display 20 for displaying data received from the test tool card 16 or to provide a user with options or possible commands for controlling the test tool card 16. A keyboard or keypad 22 is provided to permit a user to input alphanumeric data or commands for controlling test tool card 16 or to analyze or evaluate data shown in display 20.

Figure 2:
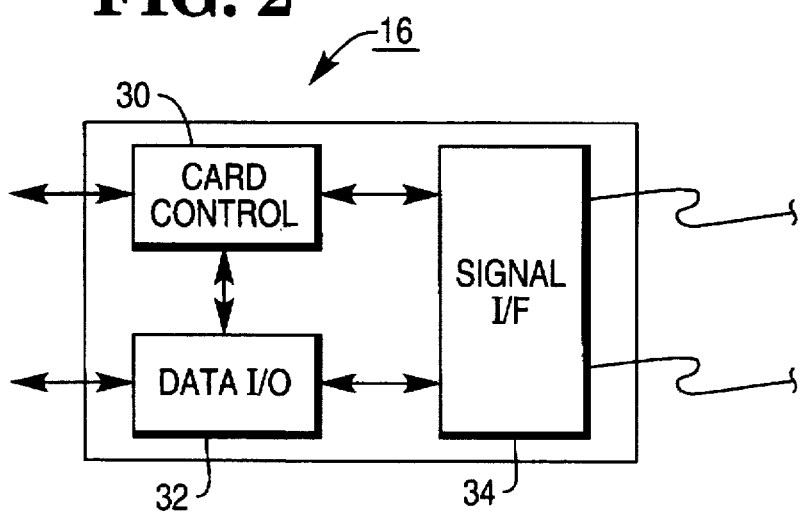
FIG. 2 is a block diagram of a test tool card shown in FIG. 1.

A block diagram of test tool card 16 is shown in FIG. 2. The card includes a card control 30, a data input/output (I/O) section 32 and a signal interface section 34. Card control section 30 receives commands from portable computer 12 via peripheral outerface 14 which are used to control signal interface 34 and to control the transmission of data from test tool card 16 to personal computer 12. Signal interface 34 provides signal conditioning for test signals provided via leads 18 to test tool card 16. This signal conditioning includes buffering, scaling, amplification, and/or electrical isolation as may be required for a particular test tool implemented on a card 16. The data I/O section 32 includes a/d converters, holding registers or data memory for retention of data until card control 30 signals section 32 to transmit the data to portable computer 12.

In the preferred embodiment of the present invention, the peripheral interface 14 is a PCMCIA interface. The first release of this interface standard was in August 1990. The PCMCIA standard defines an interface for printed circuit (PC) cards to a computer. The standard defines signals for a 64 pin connector. The definition and electrical characteristics used to define the signals for this interface are available in PCMCIA PC card standard, release 2.01 available from Personal Computer Memory Card Interface Association of Sunnyvale, Calif. The cards coupled through this interface to a portable computer are controlled through socket service and card service software which executes in portable computer 12 and is discussed in more detail below. The software components communicate with application software executing on a portable computer or may communicate with a server program executing in a remote location.

FIGS. 3(a), 3(b), and 3(c) depict the physical appearance of the various types of PC cards that may be used in the preferred embodiment of the invention. These cards conform to the physical dimensions of type I, type II, and type III cards defined in the PCMCIA standard. The card depicted in FIG. 3(a) has a length of 85.6 mm and a width of 54.0 mm and a height of 3.3 mm. The card depicted in FIG. 3(b) has the physical dimensions of 85.6 mm×54.0 mm×5.0 mm. The card depicted in FIG. 3(c) has the same height and width dimensions of the cards depicted in FIGS. 3(a) and (b) and a height dimension of 10.5 mm. The pins for coupling to the 64 pin connector of the PCMCIA interface are provided at ends 40 of the cards shown in FIGS. 3(a), (b) and (c). As is readily apparent from the description of the physical dimensions of the cards shown in FIG. 3, PC cards conforming to the PCMCIA standard are relatively small compared to previously known PC cards and a technician may carry a significant number of them without overly burdening the technician.

A block diagram of a preferred embodiment of a test tool card 16' is shown in FIG. 4. Using like numbers to describe like sections, the preferred embodiment of test tool card 16' includes a card control section 30', a data I/O section 32' and a signal interface 34. The card control section 30' includes an attribute memory 50 which includes a card information section 52 and card configuration registers 54. Data I/O section 32' includes I/O space 56 and a common memory section 58. The card information contained in card information section 52 includes information defined in the PCMCIA standard as tuples. Tuples are data structures which provide information about the test tool card such as the physical type of the card and address of the card configuration registers 54. Preferably, the tuples include a test tool identifier which identifies the functionality for the test tool and related parameters. For example, tuples for a card which implements a logic analyzer may include a test tool identifier and related parameters identifying the card as a logic analyzer and the number of channels, number of setpoint registers, or other related tool information.

Figure 5:
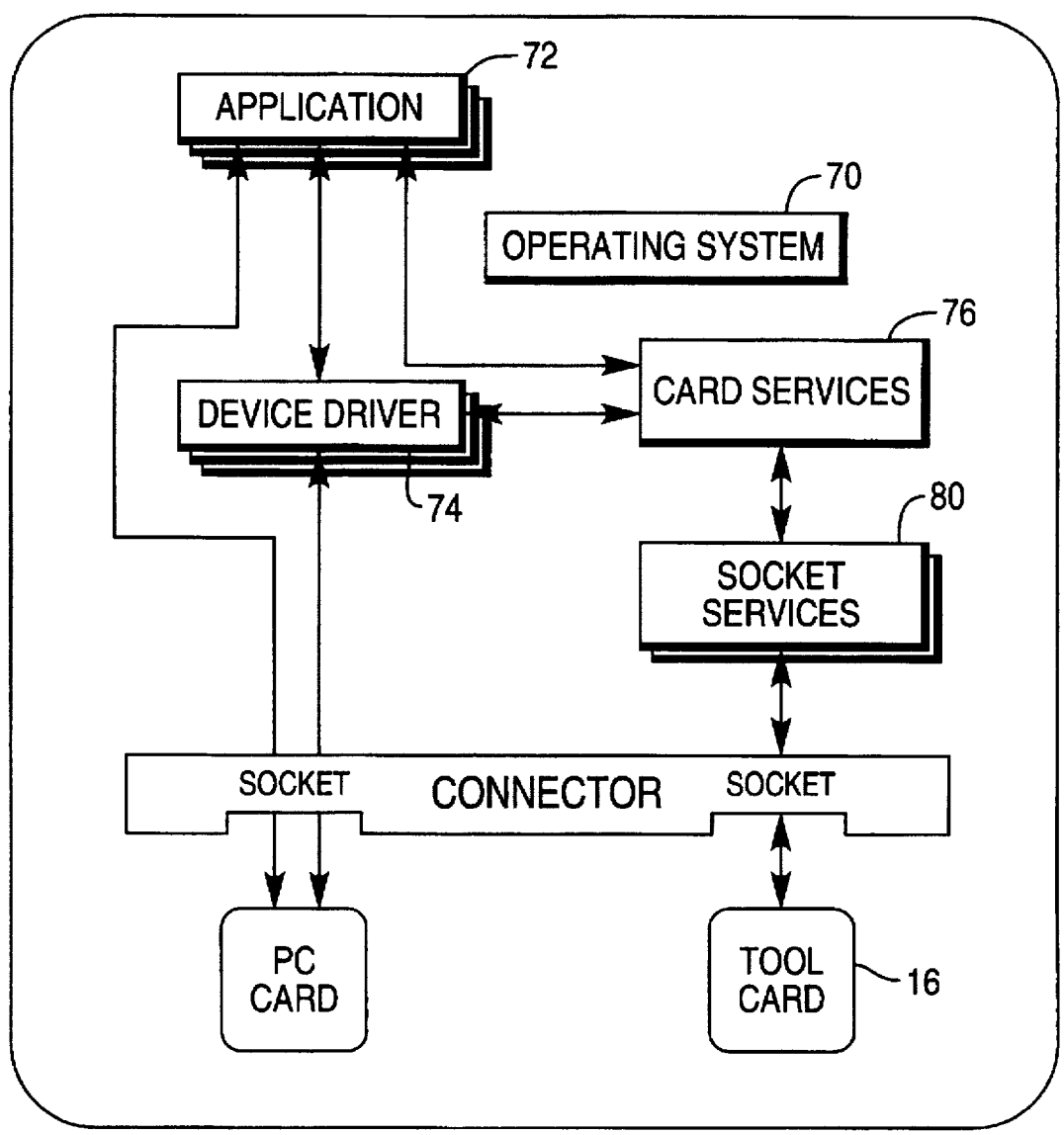
FIG. 5 is a block diagram of the system software for the portable computer shown in FIG. 1 which is used to control and receive data from the test tools.

An overview of the system software is shown in the block diagram of FIG. 5. The software for portable computer 12 includes an operating system 70, application programs 72, device drivers 74, card service module 76, and socket services 80. The operating system is one of those typically used in portable computers and does not form part of the present invention. Device drivers 74 interface the application programs 72 with devices coupled to interfaces other than the peripheral interfaces for the test tool cards and do not form part of the present invention.

The application programs 72 include programs written by a user and typically include Graphic User Interface (GUI) modules or other known graphical tools, methods, or techniques for displaying data received from the card services module 76. The application programs may receive data for more than one test tool card from card service module 76. Thus, application program 72 may juxtapose data from different test tool cards or superimpose the data from one test tool card over the data of another card. Additionally, an application program 72 may make data received from one of the test tool cards available to a data analysis package available from a software vendor to further evaluate data. For example, frequency data may be supplied to a Fourier analysis program to obtain the frequency spectrum of a signal. Use of other data analysis modules may be used as well. The results of the data analysis program may be displayed by the application program 72 to further enhance the value of the raw data received from a test tool card.

Card service module 76 is a tool interpreter which controls the communication with the test tools coupled through the peripheral interface 14. The card service module 76 uses a socket service module 80 to control and operate a test tool card 16 through the peripheral interface 14. The card service module 76 converts commands received by an application program from a user into a format that the card control section 30 of a test tool card 16 may use to control the operation of the test tool. Additionally, a card service module 76 provides data received from a test tool card 16 to the application program for display or for further analysis or evaluation. The card service module 76 is capable of supporting multiple socket services 80 and accordingly, provide a software interface for a plurality of test tool cards 16. The card service module 76 also interprets the test tool identifier from the card control section 30 to determine whether the test tool card 16 is compatible with portable computer 12. Preferably, the test tool identifier is within a tuple stored in the card information section 52 of attribute memory 50. If the test tool identifier indicates the card is not compatible with card service module 76 or the socket service module 80 for the socket to which the test tool card is coupled, the card service module 76 attempts to reconfigure the card. If it is unable to reconfigure the card so that communication through the peripheral interface 14 is possible, communication through the corresponding socket service module 80 is suspended.

Socket service modules 80 control the electrical signals output to and input from a socket that corresponds to the peripheral interface 14. In the preferred embodiment of the invention the socket service modules 80 perform the interface functions for the PCMCIA interface. Preferably, there is a one to one correspondence between the number of socket service modules 80 and the sockets for interface 14.

In operation, a technician takes a case of test tool cards 16 into the field for service purposes. Each of the cards implements one or more common test functions. Examples of these test functions include volt/ohm-meter, waveform synthesizer, A/D and D/A converter, frequency counter, spectrum analyzer, logic analyzer, oscilloscope, and spectrum generator. Upon arriving at the equipment to be tested, monitored, or evaluated, the technician powers the portable computer 12 and verifies that it is operating correctly under control of the operating system. The technician may then execute one of the application programs for a particular test sequence or test tool. The program checks to see if the test tool card or cards have been installed in the appropriate socket or sockets by communicating with the card service module 76 which in turn attempts to establish communication through the socket service modules 80 to the test tool cards. Upon the expiration of a time-out period, a message indicates to the technician that the appropriate test tool or tools have not been installed. The technician may then remove the test tool cards identified by the displayed message from the case and install them in the sockets of peripheral interface 14. After entering a command to verify the cards have been installed and receiving confirmation of that fact, the technician may then continue.

The technician then sets the parameters for a test measurement reading or the like. For example, the technician may enter commands through keyboard 22 to set the range of a resistance measurement. The application program 72 transmits the range parameters for the resistance measurement to the test tool card 16 through card service module 76 and the socket service module 80 which corresponds to the test tool 16 implementing the ohmmeter function. The technician then couples the leads across various components in the unit under test and observes the display of the resistance values displayed on the display of computer 12. The display is driven by the application program which receives data from test tool card 16 through card service module 76 and corresponding socket service module 80. The technician may continue to use the computer as a ohmmeter or may store the data or may further evaluate the data using another application program.

If the technician determines that another test instrument is needed, the test tool card implementing that function may be coupled to another socket in the interface or the test tool card for the ohmmeter may be removed and the new card coupled to the socket previously used for the ohmmeter card. A menu within the application program may then be used to select another program 72 which communicates with the new test tool card or the currently executing program 72 may already support that functionality. In that case, the application program transmits commands through interface 14 to determine the correct test tool card is in place and continues with the operation of the card as discussed above.

As understood from this description, the computer provides a general purpose processor that may be utilized by various application programs to operate test tool cards, display data from such cards, and analyze data received from such cards. The peripheral interface provides a common communication interface with a plurality of test tools cards regardless of the functionality of such cards.

While the test tool system described above constitutes the preferred embodiment of the invention, it is recognized that the invention may be carried out in other specific ways than those herein set forth without departing from the scope of the invention. The above embodiment is therefore to be considered in all respects illustrative and not restrictive or limiting of the invention defined by the appended claims.

What is claimed is:

1. A portable test tool system for field maintenance comprising:
    a portable computer having a display;
    a PCMCIA slot having a peripheral interface coupled to said portable computer for communicating data between said portable computer and a unit under test;
    a PCMCIA card which is receivable into said PCMCIA slot, said PCMCIA card having a test tool included thereon for receiving and transmitting signals between said test tool and said unit under test when said PCMCIA card is received into said PCMCIA slot, and said test tool including a test tool identifier for identifying a functionality for said test tool to said portable computer through said peripheral interface; and
    a tool interpreter for communicating with said test tool in accordance with said test tool identifier so that said portable computer may control said test tool and receive data from said test tool,
    said test tool further including a signal interface for conditioning signals received from said unit under test so that said conditional signals may be transmitted to said portable computer.

2. A portable test tool system for field maintenance comprising:
    a portable computer having a display;
    a PCMCIA slot having a peripheral interface coupled to said portable computer for communicating data between said portable computer and a unit under test;

a PCMCIA card which is receivable into said PCMCIA slot, said PCMCIA card having a test tool included thereon for receiving and transmitting signals between said test tool and said unit under test when said PCMCIA card is received into said PCMCIA slot, and said test tool including a test tool identifier for identifying a functionality for said test tool to said portable computer through said peripheral interface;

a tool interpreter for communicating with said test tool in accordance with said test tool identifier so that said portable computer may control said test tool and receive data from said test tool;

a plurality of PCMCIA cards, each of said plurality of PCMCIA cards having a test tool included thereon, said test tool identifier for each of said test tools identifying a functionality different from said other test tools; and said tool interpreter being a card service module which further includes a plurality of socket service modules, said card service module enabling one of said socket service modules in response to identification of said functionality for one of said test tools so that said card service module communicates commands and data corresponding with said identified functionality of said test tool through said interface.

3. The system of claim 2 wherein said socket service module enabled for one of said test tools communicates data to an application program for display of said data on said portable computer display.

4. The system of claim 2 wherein said interface includes a connector and each of said test tools mate with said connector.

5. The system of claim 4 wherein said data display corresponds to said functionality identified for said one of said test tools.

6. The system of claim 2 further comprising:

a second PCMCIA slot having a second peripheral interface; and first and second test tools being coupled to said first and second interfaces so that said card service module enables first and second socket service modules corresponding to said functionality identified for each of said test tools.

7. The system of claim 6 wherein each of said first and second socket service modules communicate data to said application program for display of said data on said portable computer display.

8. The system of claim 7 wherein said data for one test tool is displayed on said portable computer display in juxtaposition to said data displayed for said second test tool.

9. A portable test tool system for field maintenance comprising:

a portable computer having a display;

a PCMCIA slot having a peripheral interface coupled to said portable computer for communicating data between said portable computer and a unit under test;

a PCMCIA card which is receivable into said PCMCIA slot, said PCMCIA card having a test tool included thereon for receiving and transmitting signals between said test tool and said unit under test when said PCMCIA card is received into said PCMCIA slot, and said test tool including a test tool identifier for identifying a functionality for said test tool to said portable computer through said peripheral interface; and a tool interpreter for communicating with said test tool in accordance with said test tool identifier so that said portable computer may control said test tool and receive data from said test tool, said portable computer further comprising a keyboard for receiving tool commands from a user, said tool commands being transmitted to one of said test tools communicating through said interface.

10. A portable test tool system for field maintenance comprising:

a portable computer having a display;

a peripheral interface coupled to said portable computer for communicating data between said portable computer and a unit under test;

a test tool for receiving and transmitting signals between said test tool and said unit under test, said test tool including a test tool identifier for identifying a functionality for said test tool to said portable computer through said peripheral interface;

a tool interpreter for communicating with said test tool in accordance with said test tool identifier so that said portable computer may control said test tool and receive data from said test tool;

a plurality of test tools, said test tool identifier for each of said test tools identifying a functionality different from said other test tools; and said tool interpreter being a card service module which further includes a plurality of socket service modules in response to identification of said functionality for one of said test tools so that said card service module communicates commands and data corresponding with said identified functionality of said test tool through said interface, wherein said test tools include a voltmeter, a waveform synthesizer, a A/D converter, a D/A converter, a frequency counter, a spectrum analyzer, a logic analyzer, an oscilloscope, and a spectrum generator.

11. A portable test tool system for field maintenance comprising:

a portable computer having a display;

a PCMCIA slot having a peripheral interface coupled to said portable computer for communicating data between said portable computer and a unit under test;

a PCMCIA card which is receivable into said PCMCIA slot, said PCMCIA card having a test tool included thereon for receiving and transmitting signals between said test tool and said unit under test when said PCMCIA card is received into said PCMCIA slot, and said test tool including a test tool identifier for identifying a functionality for said test tool to said portable computer through said peripheral interface; and a tool interpreter for communicating with said test tool in accordance with said test tool identifier so that said portable computer may control said test tool and receive data from said test tool, wherein said test tool identifier is included within a tuple stored on said test tool.

* * * * *